(12) United States Patent
Byeon

(10) Patent No.: US 9,530,464 B2
(45) Date of Patent: Dec. 27, 2016

(54) SEMICONDUCTOR APPARATUS AND DATA BIT INVERSION

(71) Applicant: SK hynix Inc., Icheon-si, Gyeonggi-do (KR)

(72) Inventor: Sang Jin Byeon, Icheon-si (KR)

(73) Assignee: SK HYNIX INC., Icheon-Si (KR)

(*) Notice: Subject to any disclaimer, the term of this patent is extended or adjusted under 35 U.S.C. 154(b) by 116 days.

(21) Appl. No.: 14/329,568

(22) Filed: Jul. 11, 2014

(65) Prior Publication Data
US 2015/0269979 A1 Sep. 24, 2015

(30) Foreign Application Priority Data

Mar. 19, 2014 (KR) .................. 10-2014-0032350

(51) Int. Cl.
*G11C 7/10* (2006.01)
(52) U.S. Cl.
CPC ............. *G11C 7/10* (2013.01); *G11C 7/1006* (2013.01); *G11C 2207/105* (2013.01); *G11C 2207/107* (2013.01)
(58) Field of Classification Search
None
See application file for complete search history.

(56) References Cited

U.S. PATENT DOCUMENTS

| 8,253,244 B2* | 8/2012 | Kang | G11C 5/02 257/724 |
|---|---|---|---|
| 2008/0063395 A1* | 3/2008 | Royle | H03M 9/00 398/16 |
| 2009/0233546 A1* | 9/2009 | Sasaki | H04B 5/02 455/41.1 |
| 2011/0109382 A1* | 5/2011 | Jin | G11C 5/04 327/565 |
| 2011/0164460 A1* | 7/2011 | Kajigaya | G11C 5/02 365/189.05 |

FOREIGN PATENT DOCUMENTS

KR 1020120108474 A 10/2012

* cited by examiner

*Primary Examiner* — Idriss N Alrobaye
*Assistant Examiner* — Dayton Lewis-Taylor
(74) *Attorney, Agent, or Firm* — William Park & Associates Ltd.

(57) ABSTRACT

A semiconductor apparatus may include a first semiconductor chip; and a second semiconductor chip configured to transmit/receive signals to/from the first semiconductor chip. Further, a serializer/deserializer (SERDES) configured to serialize/deserialize input/output signals and a data bit inversion (DBI) logic electrically coupled to the SERDES and configured to perform a data inversion function on input/output data of the SERDES may be arranged in a preset region of any one of the first and second semiconductor chips.

18 Claims, 8 Drawing Sheets

10 ent application claims priority under 35 U.S.C.
SEMICONDUCTOR APPARATUS AND DATA BIT INVERSION

CROSS-REFERENCES TO RELATED APPLICATION

The present application claims priority under 35 U.S.C. §119(a) to Korean application number 10-2014-0032350, filed on Mar. 19, 2014, in the Korean Intellectual Property Office, which is incorporated herein by reference in its entirety.

BACKGROUND

1. Technical Field

Various embodiments relate to a semiconductor apparatus, and more particularly, to a semiconductor apparatus with a data bit inversion function.

2. Related Art

When a semiconductor apparatus transmits a large number of data at high speed, problems such as simultaneous switching noise (SSN), cross-talk between adjacent transmission lines, reference potential noise, and current consumption increase may occur.

In order to solve such problems, a data bit inversion (DBI) function may be used.

SUMMARY

In an embodiment of the invention, a semiconductor apparatus may include: a first semiconductor chip; and a second semiconductor chip configured to transmit/receive signals to/from the first semiconductor chip. Further, a serializer/deserializer (SERDES) configured to serialize/deserialize input/output signals and a data bit inversion (DBI) logic electrically coupled to the SERDES and configured to perform a data inversion function on input/output data of the SERDES may be arranged in a preset region of any one of the first and second semiconductor chips.

In an embodiment, a semiconductor apparatus includes a first semiconductor chip, and a second semiconductor chip stacked over the first semiconductor chip and configured to transmit and receive signals from the first semiconductor chip through one or more vias. Further, the semiconductor apparatus may include a serializer/deserializer configured to deserialize data inputted in series or serialize data transmitted in parallel from the second semiconductor chip. The semiconductor apparatus may also include a data bit inversion logic configured to perform a data inversion operation on the data deserialized through the serializer/deserializer in response to a data bit inversion signal.

DETAILED DESCRIPTION

Hereinafter, a semiconductor apparatus according to the invention will be described below with reference to the accompanying figures through various embodiments. Various embodiments are directed to a semiconductor apparatus with a data bit inversion function, which is capable of reducing noise, cross-talk, and current consumption.

Figure 1:
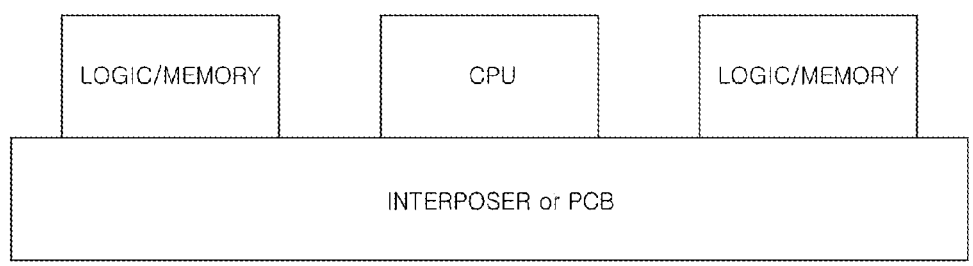
FIG. 1 illustrates the configuration of a semiconductor apparatus according to an embodiment.
Figure 2:
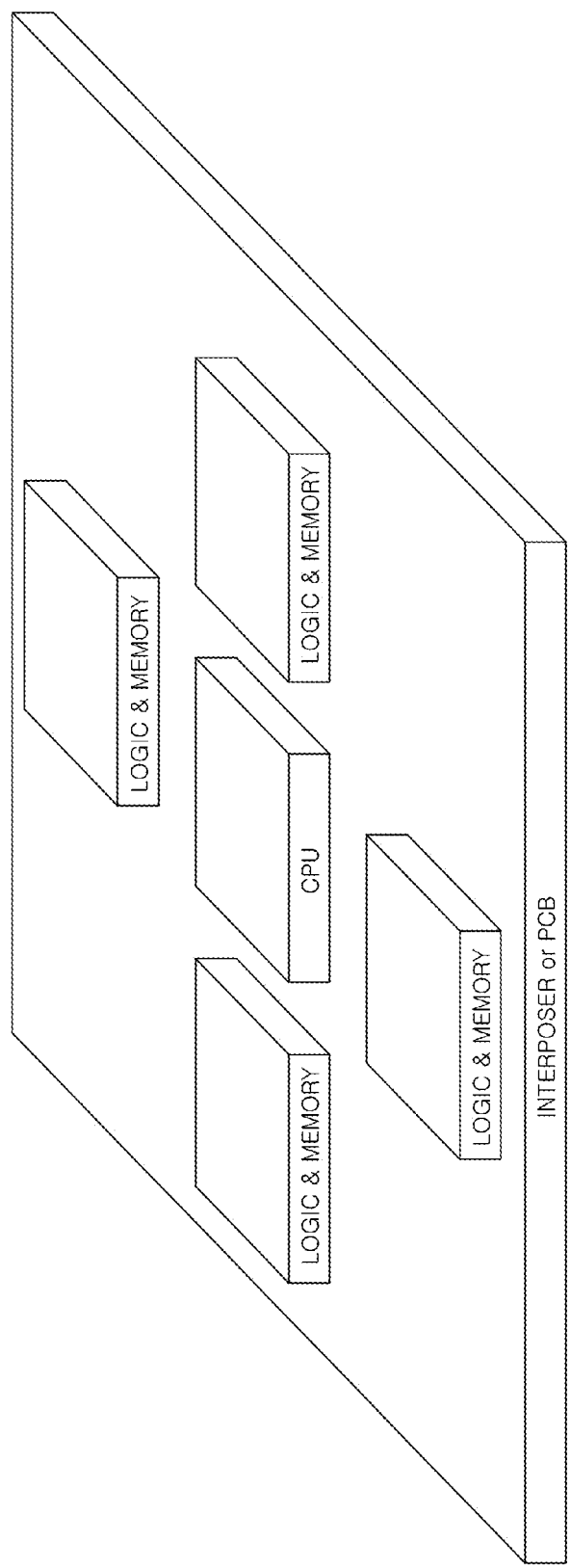
FIG. 2 is a perspective view of the semiconductor apparatus of FIG. 1.

Referring to FIGS. 1 and 2, a semiconductor apparatus 10 according to an embodiment of the invention may have a silicon-in-package (SIP) structure.

The SIP semiconductor apparatus 10 may be implemented with a 2.5D structure in which a plurality of chips are arranged in different regions over an interposer or printed circuit board (PCB).

The plurality of chips may include a CPU chip and a plurality of memory chips LOGIC/MEMORY including a plurality of control logics.

The memory chip LOGIC/MEMORY may include a memory and logic circuits related to memory control.

The plurality of memory chips LOGIC/MEMORY and the CPU chip may be electrically coupled to exchange signals through the interposer or the PCB.

Figure 3:
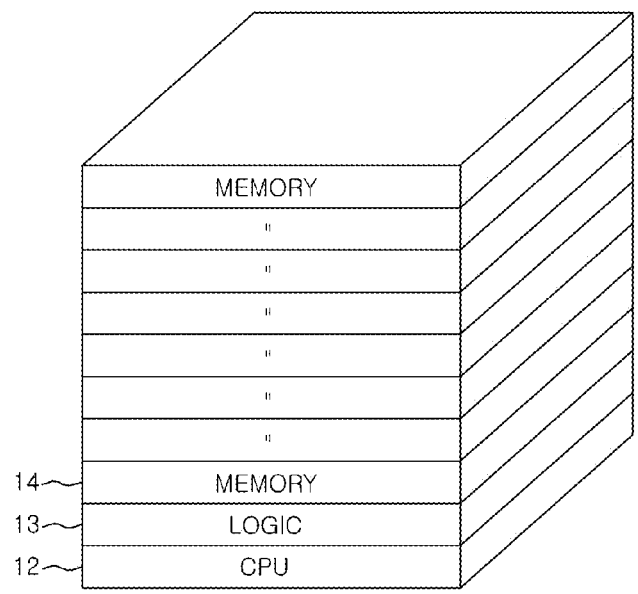
FIG. 3 is a perspective view of a semiconductor apparatus according to an embodiment.

Referring to FIG. 3, a semiconductor apparatus 11 according to an embodiment of the invention may have a 3D structure in which a logic chip 13 and a plurality of memory chips 14 are sequentially stacked over a CPU chip 12.

Figure 4:
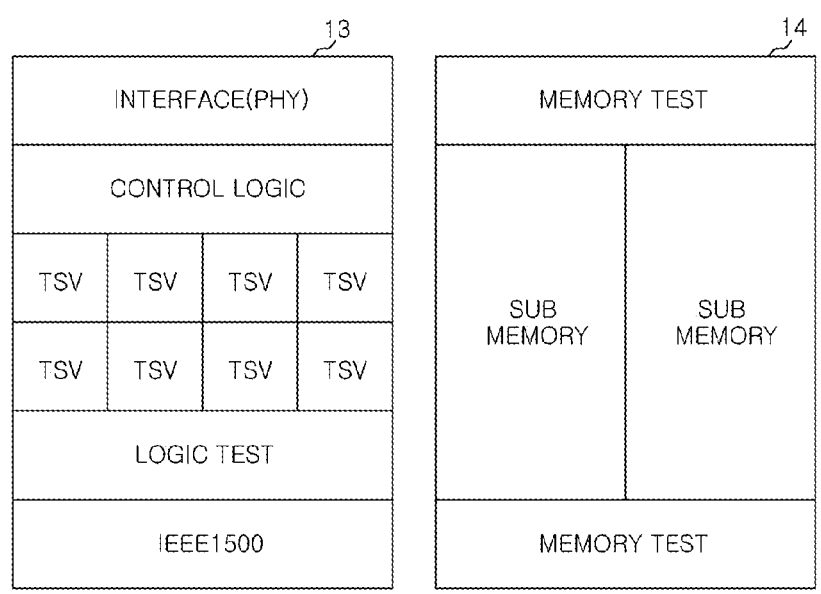
FIG. 4 is a layout diagram illustrating the configuration of a memory chip and a logic chip of FIG. 3.

Referring to FIG. 4, the logic chip 13 of FIG. 3 may include an interface circuit PHY, a control logic, a plurality of vias, for example, through silicon vias (TSVs), a logic test circuit, and a standardization control logic, for example, IEEE1500.

The memory chip 14 may include a test circuit MEMORY TEST and memories SUB MEMORY.

The memories SUB MEMORY may be divided for different channels.

At this time, the largest purpose of data bit inversion (DBI) is to reduce the amount of current by decreasing the number of data transitions. When the DBI is performed after data parallelism, the largest current reduction effect may then be expected.

Thus, various embodiments of the invention, the DBI logic may be arranged in a serializer/deserializer region SERDES to perform the DBI operation on data processed through the serializer/deserializer.

Figure 5:
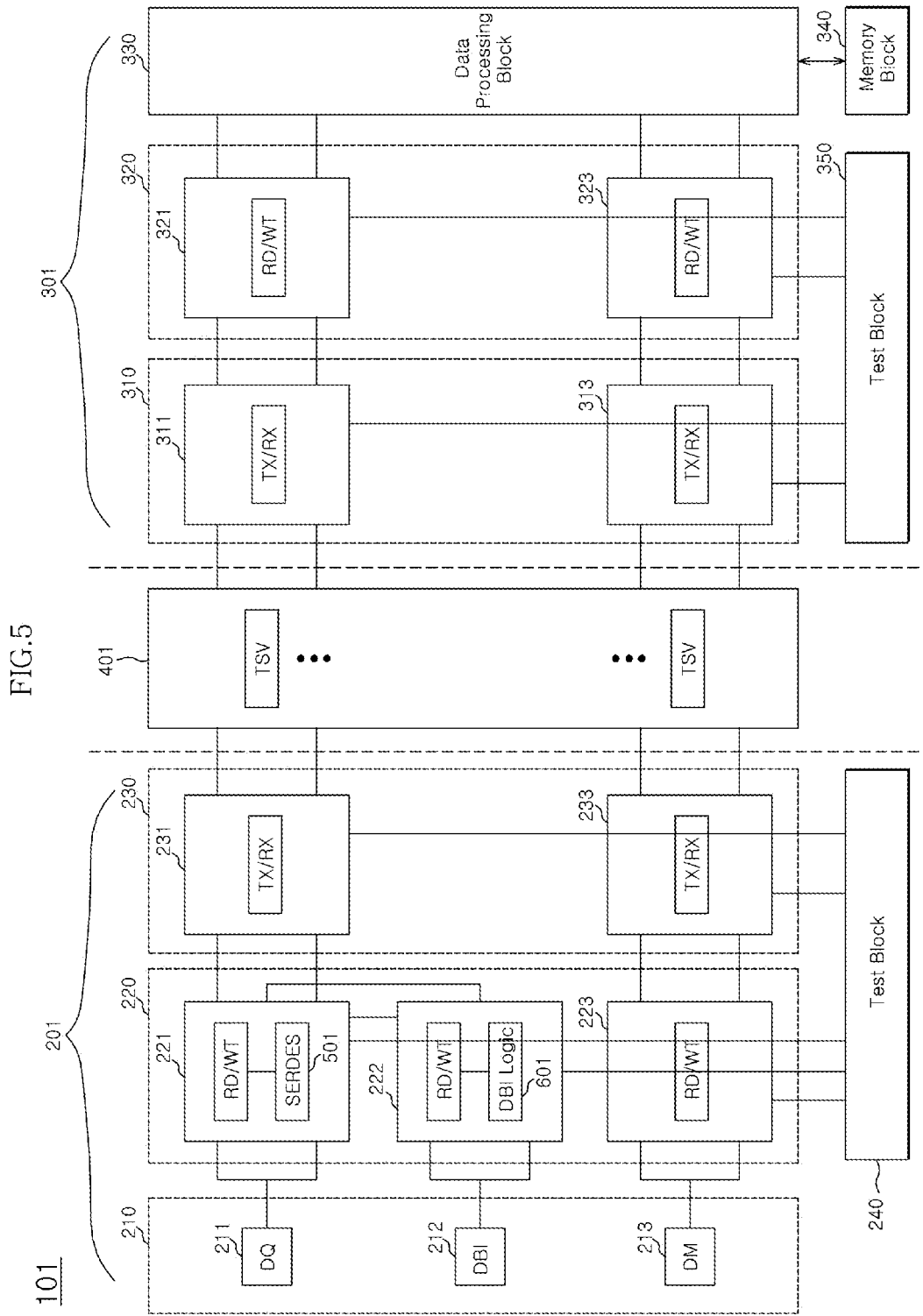
FIGS. 5 to 8 are block diagrams of semiconductor apparatuses according to other embodiments.

Referring to FIG. 5, a semiconductor apparatus 101 according to an embodiment of the invention may include a first semiconductor chip 201 and a second semiconductor chip 301 stacked over the first semiconductor chip 201 and configured to transmit/receive signals to/from the first semiconductor chip 201 through a plurality of vias TSV of a TSV region 401.

The first semiconductor chip 201 may correspond to a logic chip 13 of FIG. 3.

The second semiconductor chip 301 may correspond to a memory chip 14 of FIG. 4.

The first semiconductor chip 201 may be configured to include a pad unit 210, a first transmission/reception block 220, a second transmission/reception block 230, and a test block 240.

The first transmission/reception block 220 and the second transmission/reception block 230 may be included in the interface circuit PHY of FIG. 4.

The pad unit 210 may be configured to include a first pad 211 to input/output data and a second pad 212 to input/output a data bit inversion signal DBI.

The pad unit 210 may be configured to further include a third pad 213 to input/output a data mask signal DM.

The first transmission/reception block 220 may be electrically coupled to the pad unit 210 to perform signal transmission/reception.

The first transmission/reception block 220 may be configured to include first to third transmission/reception units 221 to 223.

The first transmission/reception unit 221 may be electrically coupled to the first pad 211, the second transmission/reception unit 222 may be electrically coupled to the second pad 212, and the third transmission/reception unit 223 may be electrically coupled to the third pad 213.

The first transmission/reception unit 221 may be configured to include a read/write interface RD/WT and a serializer/deserializer (SERDES) 501.

The SERDES 501 may be configured to deserialize data inputted in series through the pad unit 210 or serialize data transmitted in parallel through the second transmission/reception block 230 from the second semiconductor chip 301 and transmit the serialized data to the pad unit 210.

The read/write interface RD/WT may be configured to interface input/output signals related to the SERDES 501.

The second transmission/reception unit 222 may be configured to include a read/write interface RD/WT and a DBI logic 601.

The DBI logic 601 may be configured to perform a data inversion operation on read/write data serialized/deserialized through the SERDES 501.

For instance, the DBI logic 601 may be configured to perform a data inversion operation on the write data deserialized through the SERDES 501 in response to the data bit inversion signal DBI provided through the second pad 212 of the pad unit 210 from outside.

Furthermore, the DBI logic 601 may be configured to perform a data inversion operation on the read data serialized through the SERDES 501. The DBI logic 601 may also generate the data bit inversion signal DBI according to the data inversion operation.

The read/write interface RD/WT may be configured to interface input/output signals related to the DBI logic 601.

The third transmission/reception unit 223 may be configured to include a read/write interface RD/WT.

The read/write interface RD/WT may serve as an input/output interface for a data mask signal DM.

The second transmission/reception block 230 may be configured to transmit/receive signals between the first transmission/reception block 220 and the TSV region 401.

The second transmission/reception block 230 may be configured to include first and second transmission/reception units 231 and 233.

The first transmission/reception unit 231 may be configured to transmit/receive signals between the first transmission/reception unit 221 of the first transmission/reception unit 220 and the TSV region 401.

The first transmission/reception unit 231 may be configured to include a transmitter/receiver TX/RX.

The second transmission/reception unit 233 may be configured to transmit/receive signals between the third transmission/reception unit 223 of the first transmission/reception block 220 and the TSV region 401.

The second transmission/reception unit 233 may be configured to include a transmitter/receiver TX/RX.

The test block 240 may be configured to perform a data input/output test through the first transmission/reception block 220 and the second transmission/reception block 230 in response to a test command.

The second semiconductor chip 301 may be configured to include a first transmission/reception block 310, a second transmission/reception block 320, a data processing block 330, a memory block 340, and a test block 350.

The first transmission/reception block 310 may be configured to transmit/receive signals to/from the second transmission/reception block 230 of the first semiconductor chip 201 through the TSV region 401.

The first transmission/reception block 310 may be configured to include first and second transmission/reception units 311 and 313.

The first transmission/reception unit 311 may be configured to transmit/receive a signal to/from the first transmission/reception unit 231 of the second transmission/reception block 230 of the first semiconductor chip 201 through the TSV region 401.

The second transmission/reception unit 313 may be configured to transmit/receive a signal to/from the second transmission/reception unit 233 of the second transmission/reception block 230 of the first semiconductor chip 201 through the TSV region 401.

Each of the first and second transmission/reception units 311 and 313 may also include a transmitter/receiver TX/RX.

The data processing block 330 may be configured to perform a data input/output operation for the memory block 340.

The second transmission/reception block 320 may be included in a peripheral circuit region of the second semiconductor chip 301 or in a memory bank region including the memory block 340.

The second transmission/reception block 320 may be configured to transmit/receive signals between the first transmission/reception block 310 and the data processing block 330.

The second transmission/reception block 320 may be configured to include first and second transmission/reception block 321 and 323.

The first transmission/reception unit 321 may be configured to transmit/receive a signal between the first transmission/reception unit 311 of the first transmission/reception block 310 and the data processing block 330.

The second transmission/reception unit 323 may be configured to transmit/receive a signal between the second transmission/reception unit 313 of the first transmission/reception block 310 and the data processing block 330.

Each of the first and second transmission/reception units 321 and 323 may be configured to include a transmitter/receiver TX/RX.

The test block 350 may be configured to perform a data input/output test through the first and second transmission/reception blocks 310 and 320 in response to a test command.

In the semiconductor device 101 according to an embodiment, the SERDES 501 and the DBI logic 601 may be arranged in the first semiconductor chip 201, or particularly, the first transmission/reception block 220 of the first semiconductor chip 201, thereby improving the current reduction effect based on the DBI function.

Figure 6:
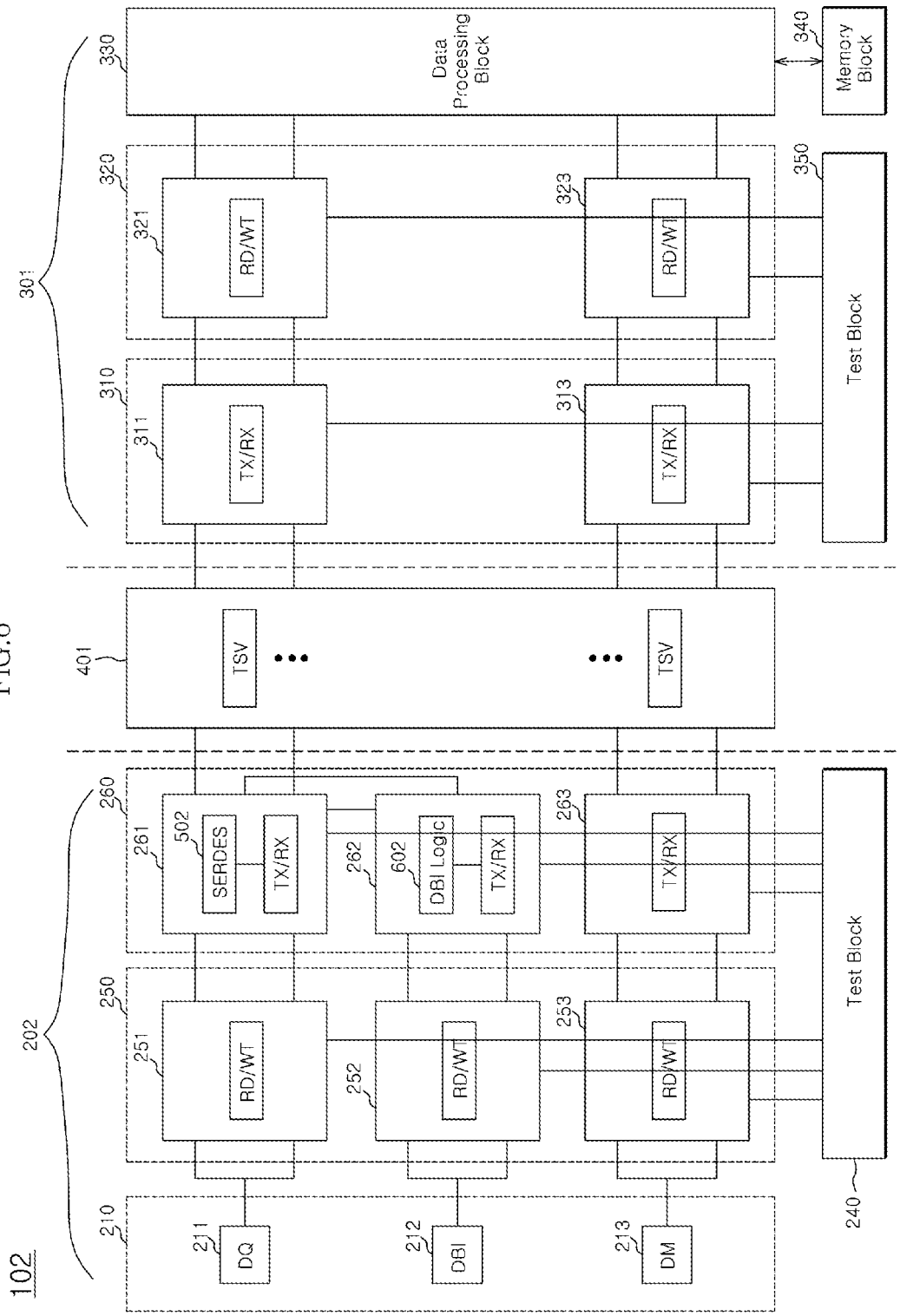

Referring to FIG. 6, a semiconductor apparatus 102 according to an embodiment may include a first semiconductor chip 202 and a second semiconductor chip 301 stacked over the first semiconductor chip 202. The second semiconductor chip 301 may be configured to transmit/receive signals to/from the first semiconductor chip 202 through a plurality of vias TSV of a TSV region 401.

The first semiconductor chip 202 may correspond to the logic chip 13 of FIG. 3.

The second semiconductor chip 301 may correspond to the memory chip 14 of FIG. 4.

The first semiconductor chip 202 may be configured to include a pad unit 210, a first transmission/reception block 250, a second transmission/reception block 260, and a test block 240.

The first transmission/reception block 250 and the second transmission/reception block 260 may be included in the interface circuit PHY of FIG. 4.

The pad unit 210 may be configured in the same manner as illustrated in FIG. 5.

The first transmission/reception block 250 may be electrically coupled to the pad unit 210 to perform signal transmission/reception.

The first transmission/reception block 250 may be configured to include first to third transmission/reception units 251 to 253.

The first transmission/reception unit 251 may be electrically coupled to the first pad 211. The second transmission/reception unit 252 may be electrically coupled to the second pad 212. Further, the third transmission/reception unit 253 may be electrically coupled to the third pad 213.

The second transmission/reception block 260 may be configured to transmit/receive signals between the first transmission/reception block 250 and the TSV region 401.

The second transmission/reception block 260 may be configured to include first to third transmission/reception units 261 to 263.

The first transmission/reception unit 261 may be configured to include a transmitter/receiver TX/RX and an SERDES 502.

The SERDES 502 may be configured to deserialize data inputted in series through the first transmission/reception unit 251 of the first transmission/reception block 250. In the alternative, the SERDES 502 may serialize data inputted in parallel through the TSV region 401 from the second semiconductor chip 301 and transmit the serialized data to the first transmission/reception unit 251 of the first transmission/reception block 250.

The transmitter/receiver TX/RX may be configured to interface input/output signals related to the SERDES 502.

The second transmission/reception unit 262 may be configured to include a transmitter/receiver TX/RX and a DBI logic 602.

The DBI logic 602 may be configured to perform a data inversion operation on read/write data which are serialized/deserialized through the SERDES 502.

For example, the DBI logic 602 may be configured to perform a data inversion operation on the write data deserialized through the SERDES 502 in response to a data bit inversion signal DBI provided through the second transmission/reception unit 252 of the first transmission/reception block 250.

Furthermore, the DBI logic 602 may be configured to perform a data inversion operation on the read data serialized through the SERDES 502. The DBI logic 602 may also generate the data bit inversion signal DBI according to the data inversion operation.

The transmitter/receiver TX/RX may be configured to interface input/output signals related to the DBI logic 602.

The third transmission/reception unit 263 may be configured to include a transmitter/receiver TX/RX.

The transmitter/receiver TX/RX may serve as an input/output interface for a data mask signal DM transmitted through the third transmission/reception unit 253 of the first transmission/reception block 250.

The test block 240 may be configured in the same manner as illustrated in FIG. 5.

The second semiconductor chip 301 may be configured in the same manner as illustrated in FIG. 5.

In the semiconductor apparatus 102, the SERDES 502 and the DBI logic 602 may be arranged in the first semiconductor chip 202, or in particular, the second transmission/reception block 260 of the first semiconductor chip 202, thereby improving the current reduction effect based on the DBI function.

Figure 7:
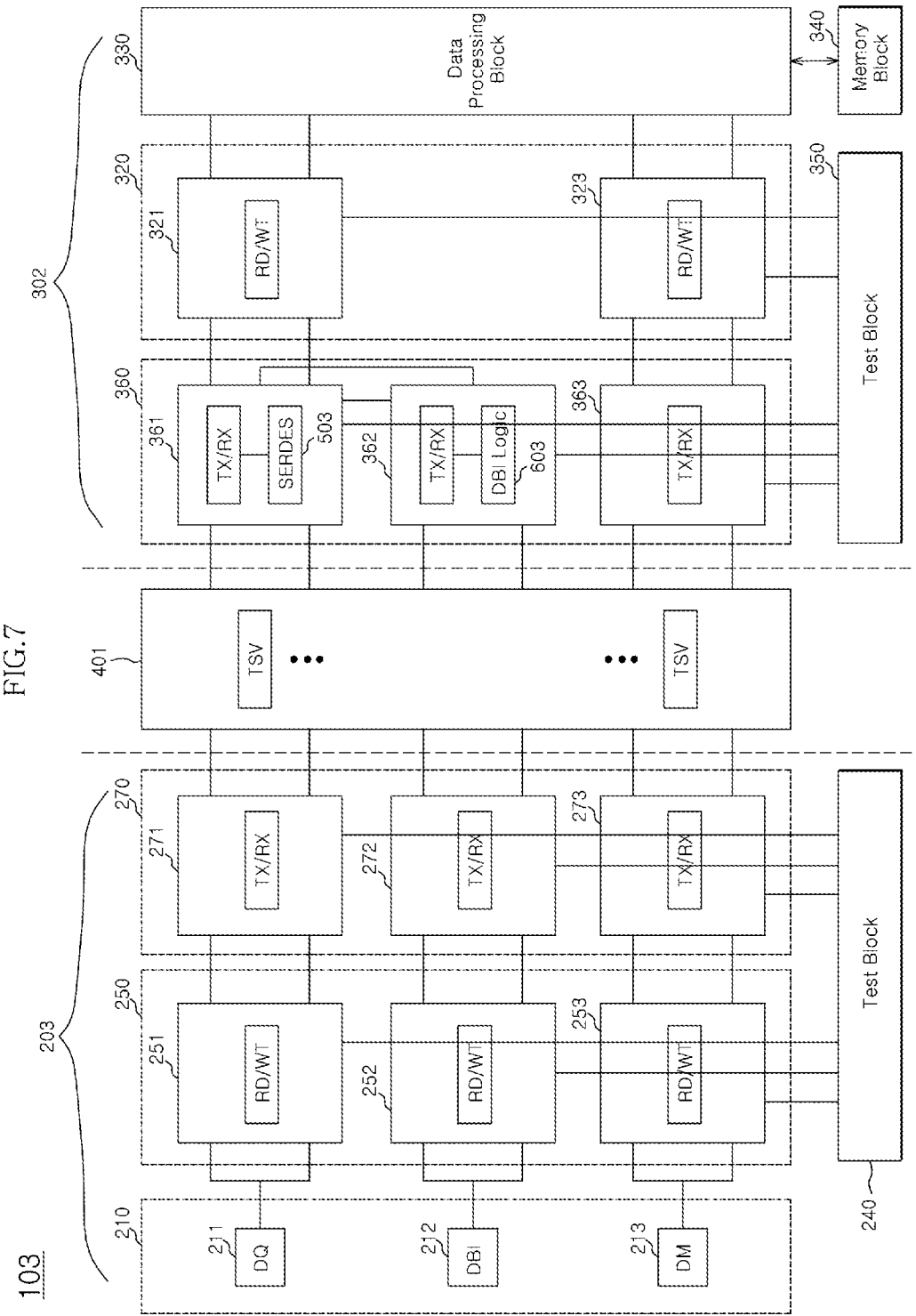

Referring to FIG. 7, a semiconductor apparatus 103 according to an embodiment may include a first semiconductor chip 203 and a second semiconductor chip 302 stacked over the first semiconductor chip 203. The second semiconductor chip 302 may be configured to transmit/receive signals to/from the first semiconductor chip 203 through a plurality of vias (TSV) of the TSV region 401.

The first semiconductor chip 203 may correspond to the logic chip 13 of FIG. 3.

The second semiconductor chip 302 may correspond to the memory chip 14 of FIG. 4.

The first semiconductor chip 203 may be configured to include a pad unit 210, a first transmission/reception block 250, a second transmission/reception block 270, and a test block 240.

The first transmission/reception block 250 and the second transmission/reception block 260 may be included in the interface circuit PHY of FIG. 4.

The pad unit 210 may be configured in the same manner as illustrated in FIG. 5.

The first transmission/reception block 250 may be configured in the same manner as illustrated in FIG. 6.

The second transmission/reception block 270 may be configured to transmit/receive signals between the first transmission/reception block 250 and the TSV region 401.

The second transmission/reception block 270 may include first to third transmission/reception units 271 to 273.

The first transmission/reception unit 271 may be electrically coupled to the first transmission/reception unit 251 of the first transmission/reception block 250. The second transmission/reception unit 272 may be electrically coupled to the second transmission/reception unit 252 of the first transmission/reception block 250. In addition, the third transmission/reception unit 273 may be electrically coupled to the third transmission/reception unit 253 of the first transmission/reception block 250.

Each of the first to third transmission/reception units 271 to 273 may include a transmitter/receiver TX/RX.

The second semiconductor chip 302 may be configured to include a first transmission/reception block 360, a second transmission/reception block 320, a data processing block 330, a memory block 340, and a test block 350.

The first transmission/reception block 360 may be configured to transmit/receive signals to/from the second transmission/reception block 270 of the first semiconductor chip 203 through the TSV region 401.

The first transmission/reception block 360 may be configured to include first to third transmission/reception units 361 to 363.

The first transmission/reception unit 361 may be configured to include a transmitter/receiver TX/RX and a SERDES 503.

The SERDES 503 may be configured to deserialize data inputted in series through the TSV region 401. In the alternative, the SERDES 503 may serialize data inputted in parallel through the second transmission/reception block 320 and transmit the serialized data to the TSV region 401.

The transmitter/receiver TX/RX may be configured to interface input/output signals related to the SERDES 503.

The second transmission/reception unit 362 may be configured to include a transmitter/receiver TX/RX and a DBI logic 603.

The DBI logic 603 may be configured to perform a data inversion operation on read/write data which are serialized/deserialized through the SERDES 502.

For example, the DBI logic 603 may be configured to perform a data inversion operation on the write data deserialized through the SERDES 503 in response to a data bit inversion signal DBI provided through the TSV region 401.

Furthermore, the DBI logic 603 may be configured to perform a data inversion operation on the read data serialized through the SERDES 503. The DBI logic 603 may also generate the data bit inversion signal DBI according to the data inversion operation.

The transmitter/receiver TX/RX may be configured to interface input/output signals related to the DBI logic 603.

The third transmission/reception unit 363 may be configured to include a transmitter/receiver TX/RX.

The transmitter/receiver TX/RX may serve as an input/output interface for a data mask signal DM transmitted through the TSV region 401.

The data processing block 330 and the memory block 340 may be configured in the same manner as illustrated in FIG. 5.

The second transmission/reception block 320 may be included in a peripheral circuit region of the second semiconductor chip 302 or a memory bank region including the memory block 340.

The second transmission/reception block 320 may be configured to transmit/receive signals between the first transmission/reception block 360 and the data processing block 330.

The second transmission/reception block 320 may be configured in the same manner as illustrated in FIG. 5.

The test block 350 may be configured to perform a data input/output test through the first and second transmission/reception blocks 360 and 320 in response to a test command.

In the above-described semiconductor apparatus 103, the SERDES 503 and the DBI logic 603 may be arranged in the second semiconductor chip 302, or particularly, the first transmission/reception block 360 of the second semiconductor chip 302, thereby improving the current reduction effect based on the DBI function.

Figure 8:
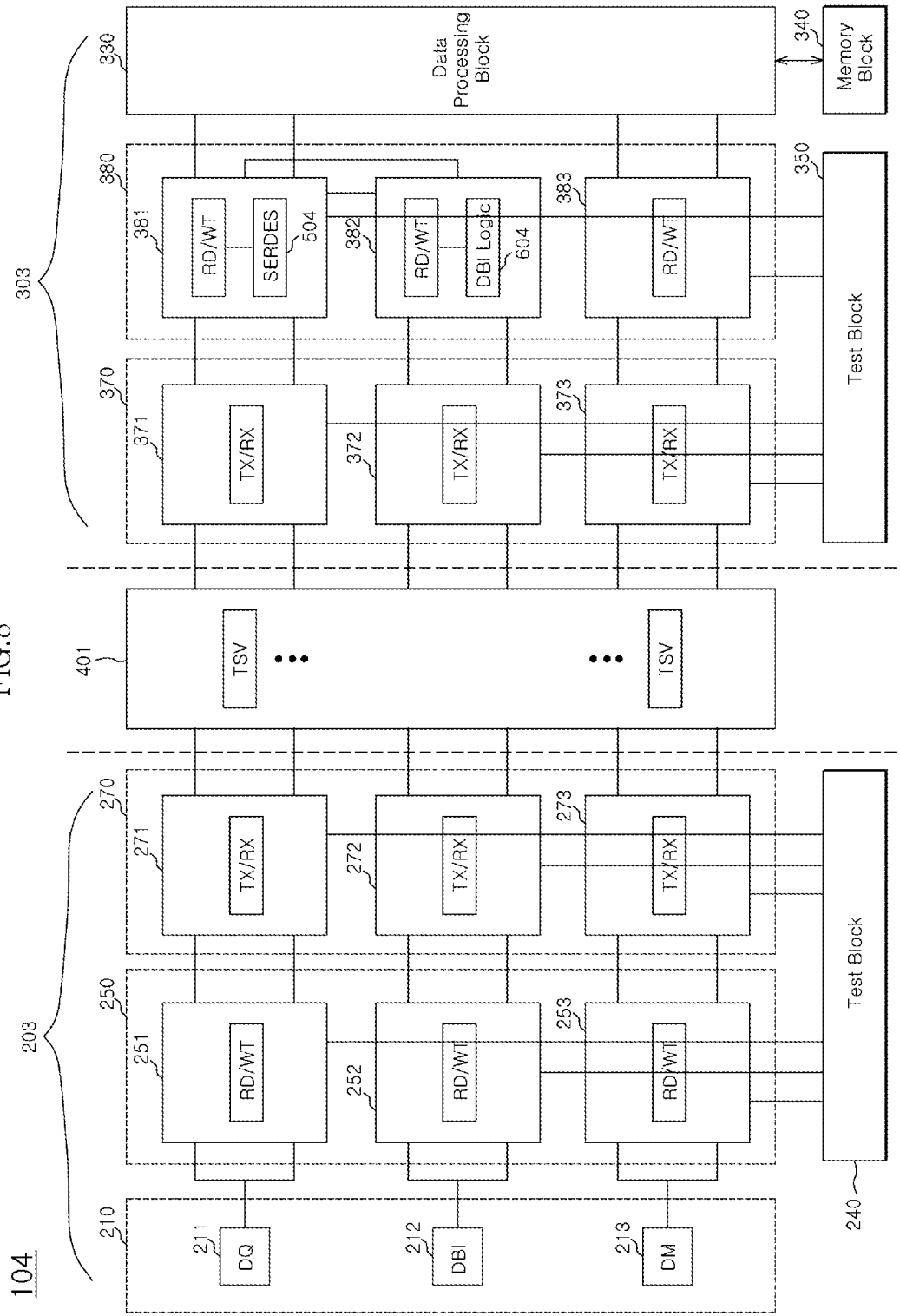

Referring to FIG. 8, a semiconductor apparatus 104 according to an embodiment may include a first semiconductor chip 203 and a second semiconductor chip 303 stacked over the first semiconductor chip 203. The second semiconductor chip 303 may be configured to transmit/receive signals to/from the first semiconductor chip 203 through a plurality of vias TSV of the TSV region 401.

The first semiconductor chip 203 may correspond to the logic chip 13 of FIG. 3.

The second semiconductor chip 303 may correspond to the memory chip 14 of FIG. 4.

The first semiconductor chip 203 may be configured in the same manner as illustrated in FIG. 7.

The second semiconductor chip 303 may be configured to include a first transmission/reception block 370, a second transmission/reception block 380, a data processing block 330, a memory block 340, and a test block 350.

The first transmission/reception block 370 may be configured to transmit/receive signals to/from the second transmission/reception block 270 of the first semiconductor chip 203 through the TSV region 401.

The first transmission/reception block 370 may be configured to include first to third transmission/reception units 371 to 373.

Each of the first to third transmission/reception units 371 to 373 may be configured to include a transmitter/receiver TX/RX.

The second transmission/reception block 380 may be included in a peripheral circuit region of the second semiconductor chip 303 or a memory bank region included in the memory block 340.

The second transmission/reception block 380 may be configured to transmit/receive signals between the first transmission/reception block 370 and the data processing block 330.

The second transmission/reception block 380 may be configured to include first to third transmission/reception units 381 to 383.

The first transmission/reception unit 381 may be configured to include a read/write interface RD/WT and a SERDES 504.

The SERDES 504 may be configured to deserialize data inputted in series through the first transmission/reception unit 371 of the first transmission/reception block 370. In the alternative, the SERDES 504 may serialize data transmitted in parallel through the data processing block 330 and transmit the serialized data to the first transmission/reception unit 371 of the first transmission/reception block 370.

The read/write interface RD/WT may be configured to interface input/output signals related to the SERDES 504.

The second transmission/reception unit 382 may be configured to include a read/write interface RD/WT and a DBI logic 604.

The DBI logic 604 may be configured to perform a data inversion operation on read/write data which are serialized/deserialized through the SERDES 504.

For example, the DBI logic 604 may be configured to perform a data inversion operation on the write data deserialized through the SERDES 504 in response to a data bit inversion signal DBI provided through the second transmission/reception unit 372 of the first transmission/reception block 370.

Furthermore, the DBI logic 604 may be configured to perform a data inversion operation on the read data serialized through the SERDES 504. The DBI logic 604 may also generate the data bit inversion signal DBI according to the data inversion operation.

The read/write interface RD/WT may be configured to interface input/output signals related to the DBI logic 604.

The third transmission/reception unit 383 may be configured to include a read/write interface RD/WT.

The read/write interface RD/WT may serve as an input/output interface for a data mask signal DB transmitted through the third transmission/reception unit 373 of the first transmission/reception block 370.

The data processing block 330 may be configured to perform a data input/output operation for the memory block 340.

The memory block 340 may be configured in the same manner as illustrated in FIG. 5.

The test block 350 may be configured to perform an input/output test through the first and second transmission/reception blocks 370 and 380 in response to a test command.

In the above-described semiconductor apparatus 104, the SERDES 504 and the DBI logic 604 may be arranged in the second semiconductor chip 303, or particularly, the second transmission/reception block 380 of the second semiconductor chip 303, thereby improving the current reduction effect based on the DBI function.

Figure 9:
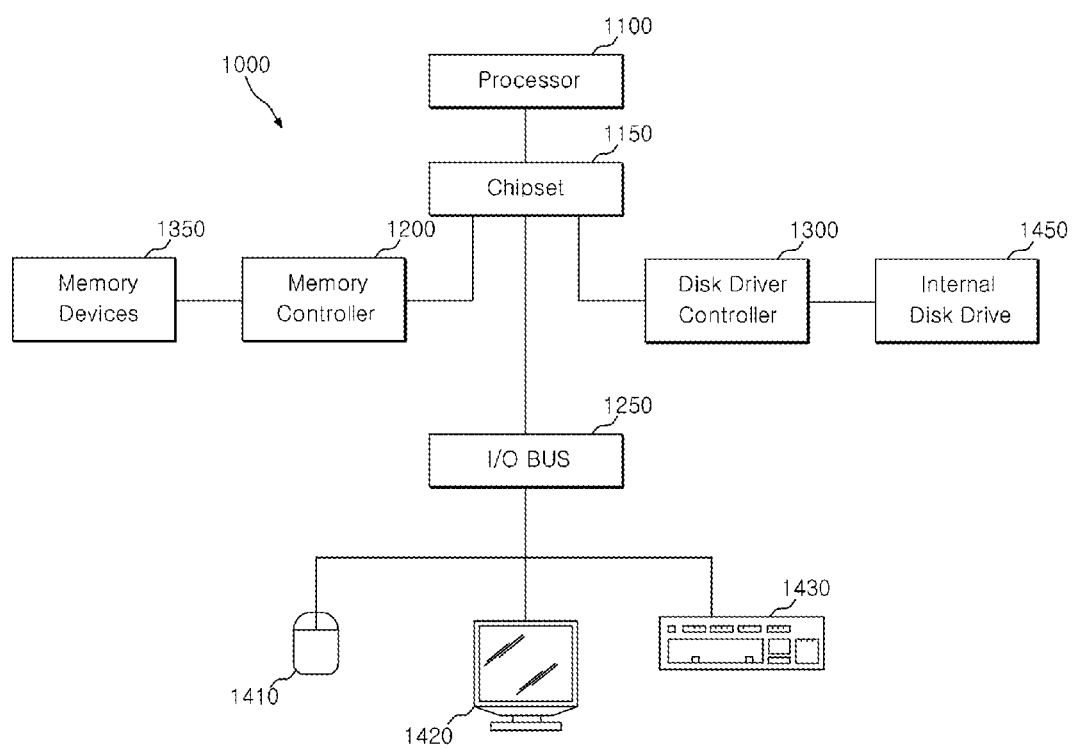
FIG. 9 illustrates a block diagram of a system employing a memory controller circuit in an embodiment of the invention.

Referring to FIG. 9, a system 1000 may include one or more processors 1100. The processor 1100 may be used individually or in combination with other processors. A chipset 1150 may be electrically coupled to the processor 1100. The chipset 1150 is a communication pathway for signals between the processor and other components of the system 1000. Other components may include a controller 1200, an input/output ("I/O") bus 1250, and a disk drive controller 1300. Depending on the configuration of the system 1000, any one of a number of different signals may be transmitted through the chipset 1150.

The memory controller 1200 may be electrically coupled to the chipset 1150. The memory controller 1200 can receive a request provided from the processor 1100 through the chipset 1150. The memory controller 1200 may be electrically coupled to one or more memory devices 1350. The memory device 1350 may include the semiconductor apparatus described above.

The chipset 1150 may also be electrically coupled to the I/O bus 1250. The I/O bus 1250 may serve as a communication pathway for signals from the chipset 1150 to I/O devices 1410, 1420 and 1430. The I/O devices 1410, 1420 and 1430 may include a mouse 1410, a video display 1420, or a keyboard 1430. The I/O bus 1250 may employ any one of a number of communications protocols to communicate with the I/O devices 1410, 1420 and 1430.

The disk drive controller 1300 may also be electrically coupled to the chipset 1150. The disk drive controller 1300 may serve as the communication pathway between the chipset 1150 and one or more internal disk drives 1450. The internal disk drive 1450 and disk drive controller 1300 may communicate with each other or with the chipset 1150 using virtually any type of communication protocol.

While certain embodiments have been described above, it will be understood to those skilled in the art that the embodiments described are by way of example only. Accordingly, the semiconductor apparatus described should not be limited based on the described embodiments. Rather, the semiconductor apparatus described herein should only be limited in light of the claims that follow when taken in conjunction with the above description and accompanying figures.

What is claimed is:

1. A semiconductor apparatus comprising:
   a first semiconductor chip;
   a second semiconductor chip configured to transmit/receive signals to/from the first semiconductor chip;
   a serializer/deserializer (SERDES) configured to serialize/deserialize input/output signals; and
   a data bit inversion (DBI) logic coupled to the SERDES and configured to perform a data inversion function on input/output data of the SERDES in response to a data bit inversion signal,
   wherein the SERDES and the DBI logic are arranged in a preset region of any one of the first and second semiconductor chips, and
   wherein the first semiconductor chip comprises:
      a pad unit configured to input/output data and the data bit inversion signal;
      a first transmission/reception block configured to transmit/receive signals to/from the pad unit; and
      a second transmission/reception block configured to transmit/receive signals between the second semiconductor chip and the first transmission/reception block.

2. The semiconductor apparatus according to claim 1, wherein the second semiconductor chip is stacked over the first semiconductor chip and configured to perform the signal transmission/reception through a plurality of vias.

3. The semiconductor apparatus according to claim 2, further comprising:
   a CPU chip coupled to a bottom portion of the first semiconductor chip.

4. The semiconductor apparatus according to claim 1, wherein the first semiconductor chip comprises an interface circuit.

5. The semiconductor apparatus according to claim 4, wherein the first semiconductor chip further comprises a standardization control logic.

6. The semiconductor apparatus according to claim 4, wherein the SERDES and the DBI logic are arranged in the interface circuit.

7. The semiconductor apparatus according to claim 1, wherein the SERDES and the DBI logic are configured within the first transmission/reception block.

8. The semiconductor apparatus according to claim 1, wherein the SERDES and the DBI logic are configured within the second transmission/reception block.

9. The semiconductor apparatus according to claim 1, wherein the first semiconductor chip comprises an interface circuit that includes one or more of the first and second transmission/reception blocks.

10. The semiconductor apparatus according to claim 1, wherein the second semiconductor chip comprises:
    a memory bank region including a memory block and a peripheral circuit region to input/output data of the memory bank region.

11. The semiconductor apparatus according to claim 10, wherein the SERDES and the DBI logic are arranged in the memory bank region or the peripheral circuit region.

12. The semiconductor apparatus according to claim 1, wherein the second semiconductor chip comprises:
    a first transmission/reception block configured to transmit/receive signals to/from the first semiconductor chip;
    a data processing block configured to perform a data input/output operation for a memory block; and
    a second transmission/reception block configured to transmit/receive signals between the first transmission/reception block and the data processing block.

13. The semiconductor apparatus according to claim 12, wherein the SERDES and the DBI logic are configured within the first transmission/reception block.

14. The semiconductor apparatus according to claim 12, wherein the SERDES and the DBI logic are configured within the second transmission/reception block.

15. The semiconductor apparatus according to claim 12, wherein the second semiconductor chip comprises:
    a memory bank region including the memory block and a peripheral circuit region to input/output data of the memory bank region, and
    one or more of the first and second transmission/reception blocks included in the memory bank region or the peripheral circuit region.

16. The semiconductor apparatus according to claim 1, wherein the DBI logic is configured to receive data outputted through the SERDES, and perform a data bit inversion operation on the received data.

17. A semiconductor apparatus comprising:

a first semiconductor chip;

a second semiconductor chip stacked over the first semiconductor chip and configured to transmit and receive signals from the first semiconductor chip through one or more vias;

a serializer/deserializer configured to deserialize data inputted in series or serialize data transmitted in parallel from the second semiconductor chip; and a data bit inversion logic coupled to the serializer/deserializer and configured to perform a data inversion operation on the data deserialized through the serializer/deserializer in response to a data bit inversion signal, wherein the first semiconductor chip comprises:

a pad unit configured to input/output data and the data bit inversion signal;

a first transmission/reception block configured to transmit/receive signals to/from the pad unit; and a second transmission/reception block configured to transmit/receive signals between the second semiconductor chip and the first transmission/reception block.

18. The semiconductor apparatus according to claim 17, wherein the data bit inversion logic is configured to generate the data bit inversion signal according to the data inversion operation.

* * * * *